United States Patent [19]
Gorrell

[11] 4,212,262
[45] Jul. 15, 1980

[54] UTILITY METER READER ALERT DEVICE

[76] Inventor: Bruce L. Gorrell, 157 N. Evergreen, Wichita, Kans. 67212

[21] Appl. No.: 7,349

[22] Filed: Jan. 29, 1979

[51] Int. Cl.² .................... G01D 11/26; G09F 9/00
[52] U.S. Cl. .................................... 116/307; 73/431
[58] Field of Search ............ 116/309, 306, 200, 284, 116/307, DIG. 23, 327; 73/273, 431 R; 232/35

[56] References Cited
U.S. PATENT DOCUMENTS

| | | | |
|---|---|---|---|
| 475,937 | 5/1892 | Ethridge | 116/313 |
| 493,851 | 3/1893 | Adsit | 116/307 |
| 646,026 | 3/1900 | Hertzer | 116/313 |
| 737,439 | 8/1903 | Michie | 73/431 X |
| 739,215 | 9/1903 | Potter et al. | 73/273 X |
| 1,880,982 | 10/1932 | Rawlings et al. | 73/431 X |
| 2,827,228 | 3/1958 | Wikert | 232/35 |
| 3,067,612 | 12/1962 | Smith | 73/273 |
| 4,092,948 | 6/1978 | Bray | 116/309 |

*Primary Examiner*—Daniel M. Yasich
*Attorney, Agent, or Firm*—Edwin H. Crabtree

[57] ABSTRACT

A utility meter reader alert device for alerting a customer of the utility company that his meter has been read by the utility company. The device includes a pivotally mounted cover mounted in front of the face of the meter. The cover is raised when the meter is read by the utility company meter reader so that the customer of the utility company is alerted that his meter has been read.

4 Claims, 6 Drawing Figures

UTILITY METER READER ALERT DEVICE

BACKGROUND OF THE INVENTION

This invention relates to a device for covering a utility meter and more particularly, but not by way of limitation, to a device which alerts a customer of a utility company that the company meter reader has read his utility meter.

Heretofore customers of a utility company had no idea when the utility company dropped by their residence or business and read the utility meter. Utility companies often estimate the monthly consumption of the product offered by the utility company without the customer being aware of this fact. Also some utility companies do not read the meter at all, but base their monthly charges on past records of usage by the customer and then only read the meter annually or semi-annually. If the meter is not read on a periodic basis, i.e., monthly, the customer or utility company may not be aware of the meter becoming broken or malfunctioning between the extended reading periods thereby giving a false reading on the product consumed when the meter is finally read.

Prior to the subject invention there were no devices similar to the subject invention for alerting customers of a utility company that their meter has been read.

SUMMARY OF THE INVENTION

The subject invention alerts a customer of a utility company that the company meter reader has read his utility meter.

The utility meter reader alert device is simple in design, inexpensive, and may be quickly mounted on various types and sizes of utility meters. The device may be installed by the utility company for the convenience of the customer or the customer may install the device.

The device includes an opaque cover which covers the meter dials in the face of the meter. The cover is pivotally mounted and when pivoted upwardly exposes the meter dials. The cover acts as a flag to alert the customer that the utility meter reader has read the meter dials.

The utility meter reader alert device includes a cover disposed in front of the face of the meter for covering the individual dials in the meter. The cover is pivotally attached to an attachment means secured to the meter. When the cover is pivoted upward the individual dials are exposed for reading by the utility company meter reader.

The advantages and objects of the invention will became evident from the following detailed description of the drawings when read in connection with the accompanying drawings which illustrate preferred embodiments of the invention.

DETAILED DESCRIPTION OF THE DRAWINGS

Figure 1:
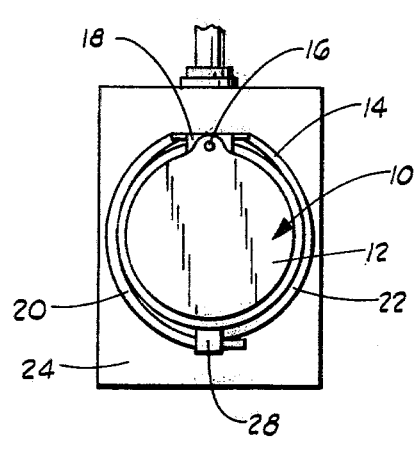
FIG. 1 is a front view of the utility meter reader alert device mounted on a standard utility meter with the cover of the device disposed in front of the face of the meter.

In FIG. 1 the utility meter reader alert device is designated by general reference numeral 10. The device 10 includes an annular opaque cover 12 pivotally attached to an elongated strap 14 by a pivot pin 16. The strap 14 includes a base 18 with two elongated arms 20 and 22 extending outwardly therefrom and wrapped around a standard utility meter 24 having a glass face 26 extending outwardly therefrom. One of the elongated arms 22 of the strap 14 includes a buckle 28 for receiving the end of the opposite arm 22 therein and securing the device 10 to the glass face 26 of the meter 24.

Figure 2:
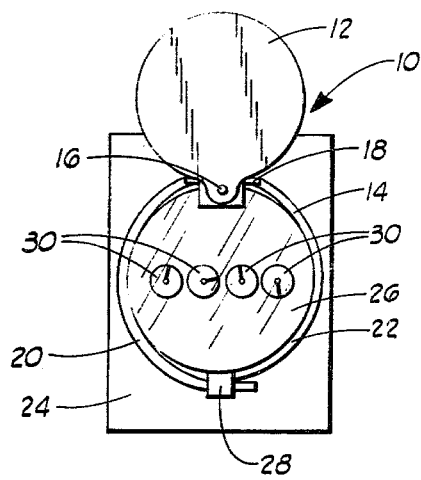
FIG. 2 is a front view of the device with the cover pivoted upwardly exposing the face of the meter and the meter dials.

In this position the opaque annular cover 12 covers the front of the glass face 26 of the meter 24 and the meter dials 30 shown in FIG. 2 which indicate the consumption of the utility used by a customer of the utility company.

In FIG. 2 a meter reader of the utility company has come by and read the dials 30 in the glass face 26 of the meter 24. He has done this by rotating the opaque annular cover 12 of the device 10 upwardly into a raised position thereby exposing the meter dials 30 for his review. When the meter 24 has been read the meter reader leaves the opaque cover 12 in a raised position to alert the customer of the utility company that he has been by and his meter has been read. The cover 12 may be painted bright colors such as red or yellow to further enhance the alerting of the customer.

Figure 3:
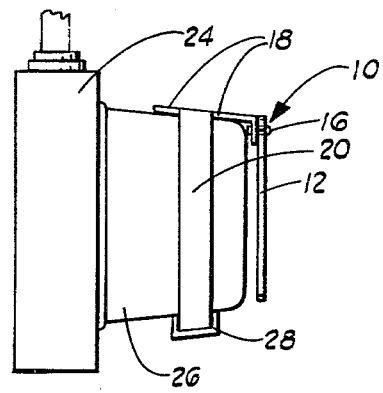
FIG. 3 is a side view of the device as shown in FIG. 1.

FIG. 3 is a side view of the meter 24 showing the device 10 with the annular opaque cover 12 in a lowered position similar to the position of the device 10 shown in FIG. 1. In this view the arm 20 of the strap 14 can be seen wrapped around the side of the glass front 26 and received in the buckle 28 of the arm 22. Also seen in this view is the base 18 receiving the pivot pin 16 and attached to the top of the cover 12 for pivoting the cover 12 thereon.

Figures 4, 4A, 5:
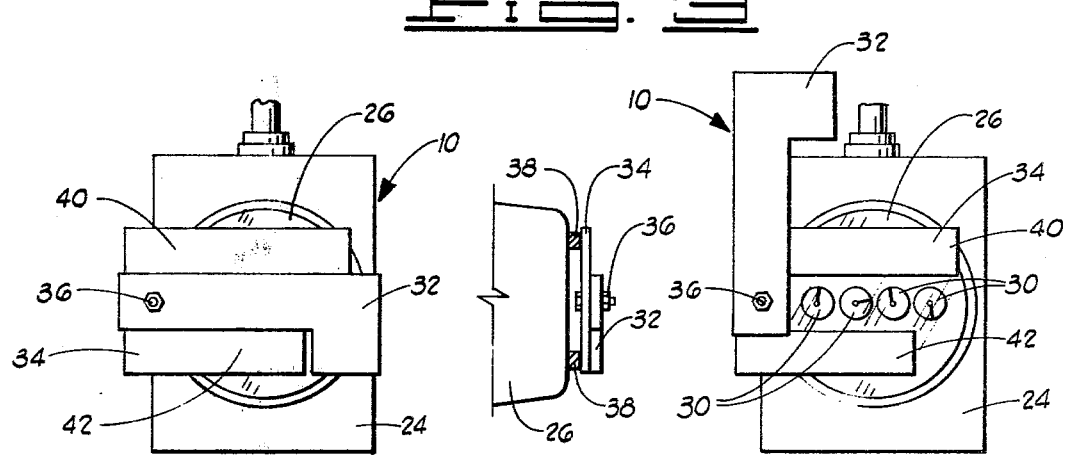
FIG. 4 is a front view of an alternate embodiment of the device mounted on the utility meter.
FIG. 4a is a partial side view showing the device in FIG. 4 attached to the front of the meter.
FIG. 5 is similar to FIG. 4 with the cover in a raised position exposing the meter dials of the meter.

In FIG. 4 an alternate embodiment of the utility meter reader alert device 10 is shon having an L-shaped cover 32 pivotally attached to a U-shaped mounting bracket 34 by a pivot pin 36. The pivot pin 36 may be any type of pin, rivot, nut and screw, or the like.

In FIG. 4a the U-shaped mounting bracket 34 can be seen attached to the front of the glass face 26 of the meter 26 by adhesive tabs 38.

In FIG. 5 the L-shaped opaque cover 32 has been pivoted upwardly into a raised position thereby acting as a flag to alert the customer that his meter has been read by the utility company's meter reader. The U-shaped mounting bracket 34 can be seen with arms 40 and 42. The arms 40 and 42 are disposed above and below the dials 30 of the meter 24 so that the dials 30 are exposed for viewing when the opaque L-shaped cover 32 is pivoted upwardly on the bracket 34.

While the two embodiments of the utility meter reader alert device 10 are shown in the drawings it should be appreciated that various shapes and sizes of this invention may be used equally well to cover and then expose the meter dials 30 of a utility meter 24 and still fall within the scope of this invention.

Changes may be made in the construction and arrangement of the parts or elements of the embodiments as described herein without departing from the spirit or scope of the invention defined in the following claims.

What is claimed is:

1. A utility meter reader alert device for alerting a customer of a utility company that his utility meter, having an outwardly extending face, has been read by the utility company, the device comprising:
    a cover disposed in front of the glass face of the meter and dimensioned for covering the individual dials in the meter, the dials indicating the usage of the utility by the customer; and
    attachment means for securing the cover to the outwardly extending glass face of the meter, the cover pivotally attached to the attachment means and parallel to the front of the face of the meter so that the cover may be rotated thereon to expose the individual dials in front of the meter when the meter has been read by the utility company.

2. The device as described in claim 1 wherein, the cover is opaque and annular in shape, the attachment means including a strap having a base with two outwardly extending arms which are received around the side of the meter, one arm having a strap buckle attached thereto, one end of the other arm received in the buckle for securing the cover to the front of the meter, the cover pivotally attached to the base by a pivot pin.

3. The device as described in claim 1 wherein, the cover is opaque and has an L-shaped configuration, the L-shaped cover pivotally attached to the attachment means which includes a U-shaped mounting bracket having adhesive tabs mounted on the rear thereof, the U-shaped mounting bracket secured to the front of the meter by the tabs, the opening between the U-shaped mounting bracket sufficient to expose the individual dials of the meter when the cover is in a raised position, the L-shaped cover in a lowered position disposed in front of the opening of the U-shaped mounting bracket for covering the individual dials in the meter.

4. The device as described in claims 2 and 3 wherein, the cover is coated with a bright color for alerting the customer of the utility company when his meter has been read.

* * * * *